United States Patent [19]
Young

[11] Patent Number: 5,517,135
[45] Date of Patent: May 14, 1996

[54] BIDIRECTIONAL TRISTATE BUFFER WITH DEFAULT INPUT

[75] Inventor: Steven P. Young, San Jose, Calif.

[73] Assignee: Xilinx, Inc., San Jose, Calif.

[21] Appl. No.: 507,626

[22] Filed: Jul. 26, 1995

[51] Int. Cl.⁶ .............................................. H03K 19/0175
[52] U.S. Cl. .................... 326/86; 326/83; 326/57
[58] Field of Search .......................... 326/83, 86, 56–58, 326/49–50, 62

[56] References Cited

U.S. PATENT DOCUMENTS

| | | | |
|---|---|---|---|
| 34,363 | 8/1993 | Freeman | 307/465 |
| 4,621,202 | 11/1986 | Pumo | 326/83 |
| 4,680,491 | 7/1987 | Yokouchi | 326/86 |
| 4,695,740 | 9/1987 | Carter | 307/242 |
| 4,713,557 | 12/1987 | Carter | 307/242 |
| 4,835,418 | 5/1989 | Hsieh | 307/473 |
| 4,987,319 | 1/1991 | Kawana | 326/86 |
| 5,248,908 | 9/1993 | Kimura | 326/56 |

*Primary Examiner*—Edward P. Westin
*Assistant Examiner*—Andrew Sanders
*Attorney, Agent, or Firm*—Edel M. Young

[57] ABSTRACT

A bidirectional tristate buffer includes a default input such that the signal applied to one of the lines connected to the bidirectional buffer is always applied to the input terminal of a buffer element in the bidirectional buffer and applied by the output terminal of the buffer element to any load which may be driven by the buffer output terminal. In a preferred embodiment, the tristate bidirectional buffer with default input requires only four transistors plus the transistors which comprise the buffer element and memory cells for controlling the direction.

6 Claims, 4 Drawing Sheets

BIDIRECTIONAL TRISTATE BUFFER WITH DEFAULT INPUT

FIELD OF THE INVENTION

The invention relates to programmable logic devices formed in integrated circuits and more particularly to field programmable logic devices or field programmable gate arrays.

BACKGROUND OF THE INVENTION

Bidirectional buffers are known and are used in such programmable applications as FPGAs and other structures in which a signal on a line is to be amplified, but signal flow may be in either direction on the line. Prior art bidirectional buffers are known which comprise a pair of buffers connected to a line, in which one buffer amplifies in one direction and the other amplifier amplifies in the other direction. Control means then select the direction. Such a bidirectional buffer is described by Freeman in U.S. Reissue Patent Re 34,363 and shown in FIGS. 10a and 10b of that patent. Bidirectional buffers having only a single buffer element are described by Carter in U.S. Pat. Nos. 4,695,740 and 4,713,557. A three-state bidirectional buffer is described by Hsieh in U.S. Pat. No. 4,835,418. The above four patents are incorporated herein by reference.

In the integrated circuit industry, it is desirable to develop circuit structures which accomplish their purpose in the smallest possible space and operate at the highest possible speed.

SUMMARY OF THE INVENTION

According to the invention, a bidirectional tristate buffer includes a default input such that the signal applied to one of the lines connected to the bidirectional buffer is always applied to the input terminal of a buffer element in the bidirectional buffer. As an additional feature, the signal on the default input line is applied by the output terminal of the buffer element to any load which is to be driven by the default input line. Thus the buffer is never left floating, and the load connected to the output terminal of the buffer switches more quickly than if a signal had to flow through another pass transistor as with a symmetrical tristate bidirectional buffer or if the default input line had to drive its load directly. In a preferred embodiment, the tristate bidirectional buffer with default input requires only four transistors plus the transistors which comprise the buffer element and memory cells for controlling the direction. Further, attaching a load to the output terminal of the buffer element may allow the direction control transistors to be smaller for the same switching speed than attaching the load directly to the line carrying the signal to be buffered.

In an architecture having line segments joined by bidirectional buffers, having programmable connections to the line segments for driving the line segments, and having loads to be driven by line segments, a structure which connects the load to be driven by the line segment to that buffer element having the line segment as its default input decreases the capacitance of the line segment and thus increases the speed of signal propagation from one line segment to the next.

DETAILED DESCRIPTION

Figure 1:
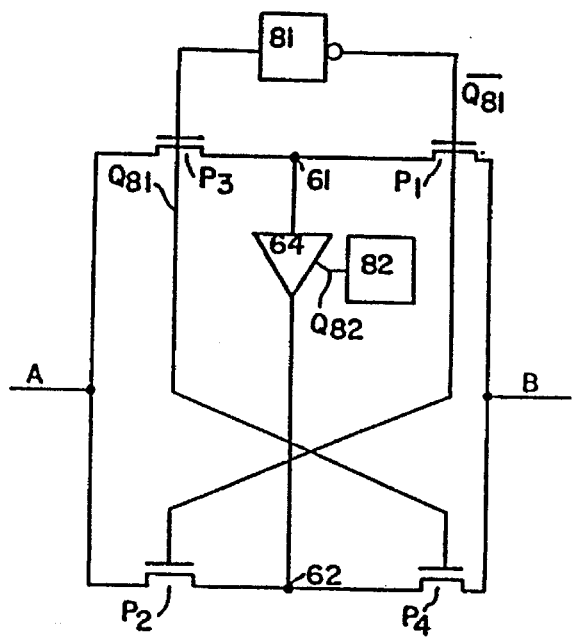
FIGS. 1 and 2 illustrate prior art tristate bidirectional buffers.

The buffer of prior art FIG. 1 uses one memory cell 81 to control the direction of signal flow and another memory cell 82 to control the tristate mode. The tristate control may comprise a pass transistor at the output of the buffer, a pair of commonly controlled transistors in series with the buffer transistors. In these cases, the signal from buffer 64 must pass through at least two pass transistors before reaching its destination. In another tristate control, a decoder turns off both CMOS driver transistors in the buffer element, in which case the control structure switches more slowly due to the decoder logic. In prior art FIG. 2, buffer 64 does not include a tristate control, thus the signal from buffer 64 must pass through one less transistor before reaching its destination. However FIG. 2 includes two additional transistors P5 and P6 to prevent the buffer input from floating in tristate mode.

Figure 2:
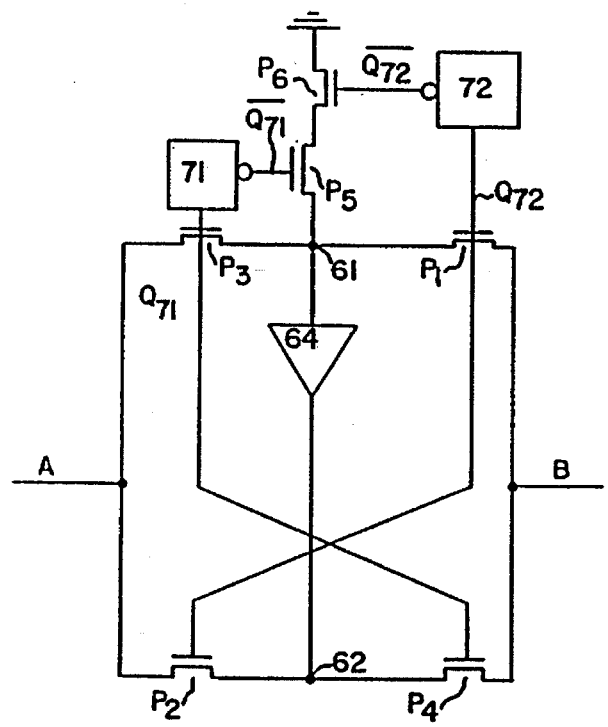
Figure 3:
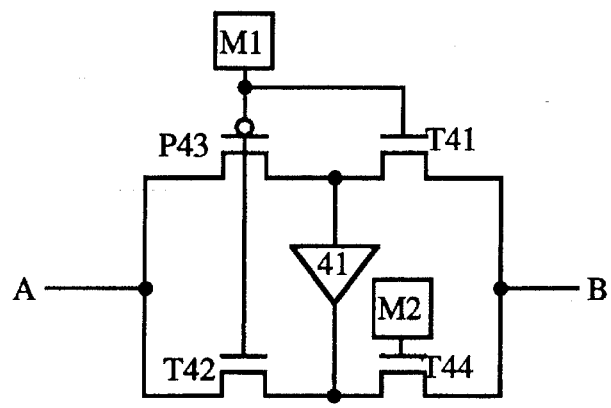
FIGS. 3, 4, and 5 illustrate bidirectional buffers according to the present invention.

FIG. 3 illustrates a bidirectional buffer of the present invention in which the bidirectional buffered connection between line segments A and B includes a default input from line A to the buffer when the buffer is in a tristate mode. (Thus, transistors P5 and P6 of FIG. 2 are unnecessary in FIG. 3.)

As shown in FIG. 3, the bidirectional buffer includes one buffer element 41. Two memory cells M1 and M2 control the direction of signal flow and whether the buffer is in a tristate mode. When M1 and M2 both hold logical 0, the buffer is in a tristate mode, driving neither of line segments A or B. But P-channel transistor P43 is on, and therefore the signal on line segment A is applied to the input terminal of buffer 41. When M1 is logical 0 and M2 is logical 1, transistors P43 and T44 are both on, thus the signal at line segment A is applied by buffer element 41 to line segment B. When M1 is logical 1 and M2 is logical 0, transistors T41 and T42 are both on and the signal at line segment B is applied by buffer element 41 to line segment A. Thus the input to buffer 41 is never left floating. (Memory cells M1 and M2 are never set to logical 1 at the same time, as this arrangement would latch the value in buffer element 41 to drive line segments A, and B, and this would produce contention with a signal which is intended to drive A or B.)

Figure 4:
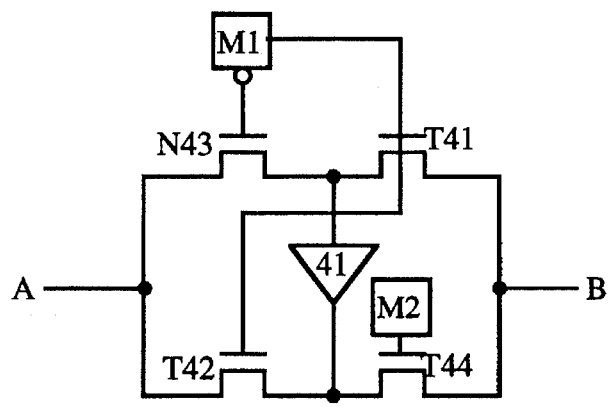

FIG. 4 illustrates another embodiment of the present invention. In FIG. 4, P-channel transistor P43 (of FIG. 3) is replaced by N-channel transistor N43, and the signal for driving the gate of N43 is taken from the inverted terminal of memory cell M1. This embodiment has the advantage that all transistors for controlling the bidirectional buffer of FIG. 4 are N-channel, and may produce a more compact layout.

Figure 5:
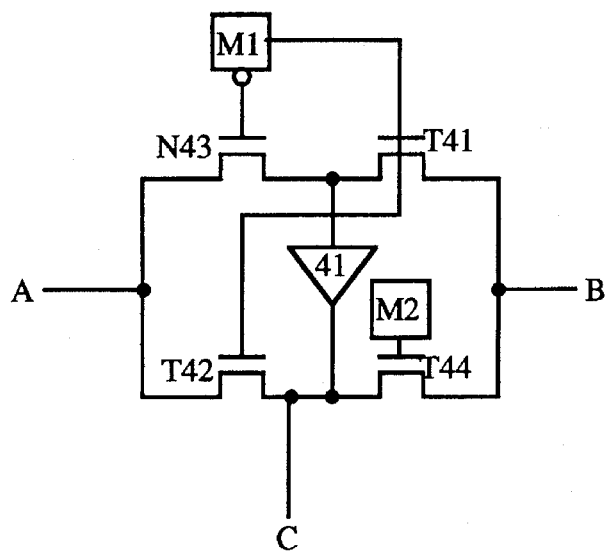

FIG. 5 illustrates another aspect of the invention. An output line C connected directly to the output terminal of buffer element 41 drives loads which are to be driven by line segment A. Since line segment A is always connected to either the input or output terminal of buffer element 41, and the output terminal of buffer element 41 is always connected to line segment C, line segment A may be understood to be a source of a signal to line segment C in all configurations. So the bidirectional buffer output of FIG. 5 drives the attached load no matter which way the buffer is pointing and can be used to drive anything unidirectional. Since line segment C is directly connected to the output of buffer element 41, connecting those loads which are to be driven by line segment A to the output of buffer 41 reduces the load which must be driven by the signal driving line segment A. The propagation speed is increased by decreasing the capacitance on the line which is on the critical path.

Providing line segment C for driving loads to be always driven by line segment A reduces the total area of the bidirectional buffer of FIG. 3 (or for a given area, the structure increases speed) compared to prior art tristate bidirectional buffers shown in FIGS. 1 and 2. For a given performance (speed), the structure of FIG. 5 reduces the required size of transistor T42 as well as the required sizes of any transistors which carry a signal to line segment A. Similarly, when line segment B is the output line segment, connecting some of the load driven by line segment B to the corresponding line segment C in another bidirectional buffer above the one shown rather than directly to line segment B reduces the required size of transistor T44. Anything which drives line segment A or is itself bidirectional may be attached directly to line segment A. The benefit of FIG. 5 is discussed further in connection with FIG. 7.

Figure 6:
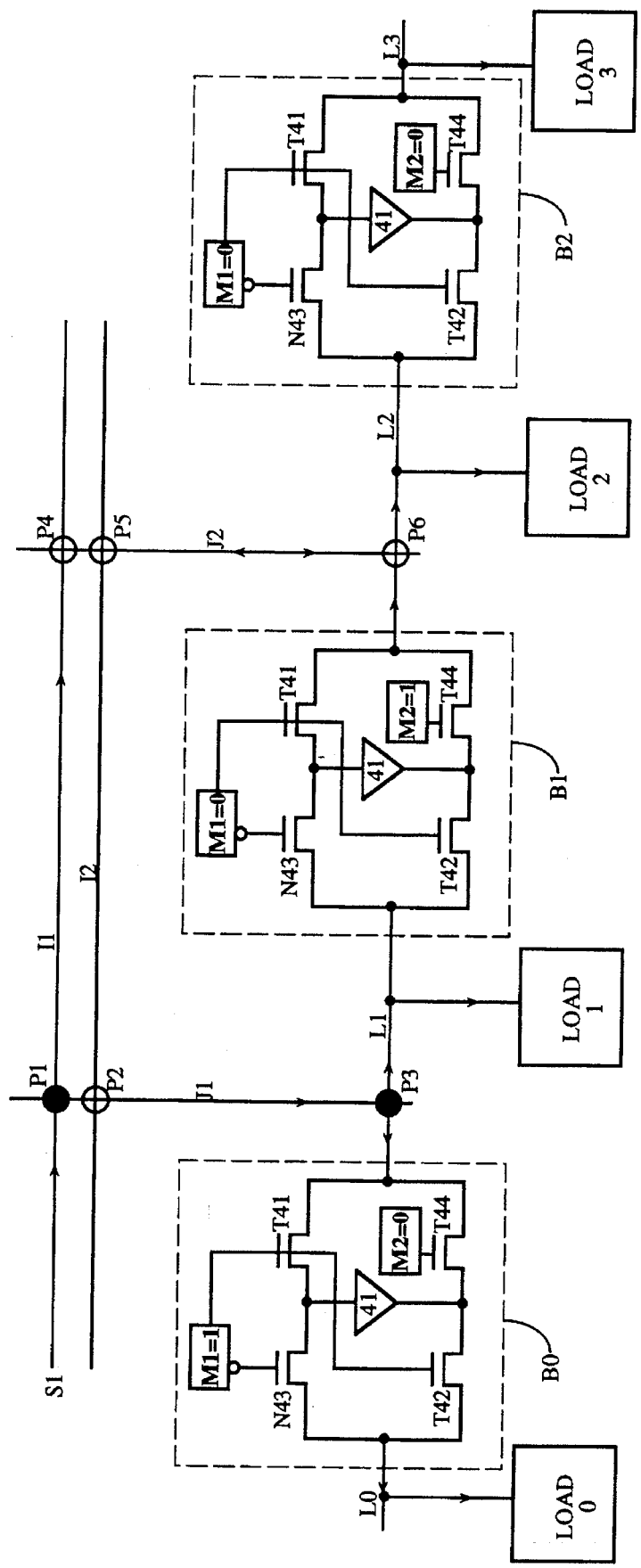
FIG. 6 illustrates tristate bidirectional buffers of the invention joining a series of line segments, with loads attached directly to the line segments.

FIG. 6 shows a series of bidirectional buffers B0, B1, and B2 which programmably connect a series of line segments L0–L3. In the embodiment of FIG. 6, loads LOAD0–LOAD3 are connected to corresponding line segments L0–L3. Load LOAD1, which is driven by line L1, has been programmably connected by programmable interconnection points (PIPs) P1 and P3 to a signal source S1, as indicated by the black circles. PIP P1 connects interconnect line L1 to connection line J1 and PIP P3 connects connection line J1 to line L1. (White circles indicate that other PIPs P2, P4, P5, and P6 have not been programmed to connect.) Also lines such as J1 and J2 and PIPs which connect to them may be used to route signals from lines such as L1 to another destination, and thus these lines and PIPs are bidirectional in nature.

In buffer B0, memory cell M1 has been set to logic 1 and M2 has been set to logic 0. Thus buffer B0 will drive the signal on line L1 onto line L0. In buffer B1, memory cell M1 is set to logic 0 and M2 is logic 1. Thus buffer B1 drives the signal on line L1 onto line L2. Buffer B2 is set to a tristate mode by setting memory cells M1 and M2 to logic 0, so buffer B2 isolates line L2 from line L3. This configuration causes signal S1 to drive loads LOAD0, LOAD1, and LOAD2.

Importantly, according to the invention, signal S1 also drives buffer element 41 in buffer B2, so the input terminal is not left floating, Yet unlike prior art tristate bidirectional buffers, no additional transistors have been added to achieve the tristate configuration.

Figure 7:
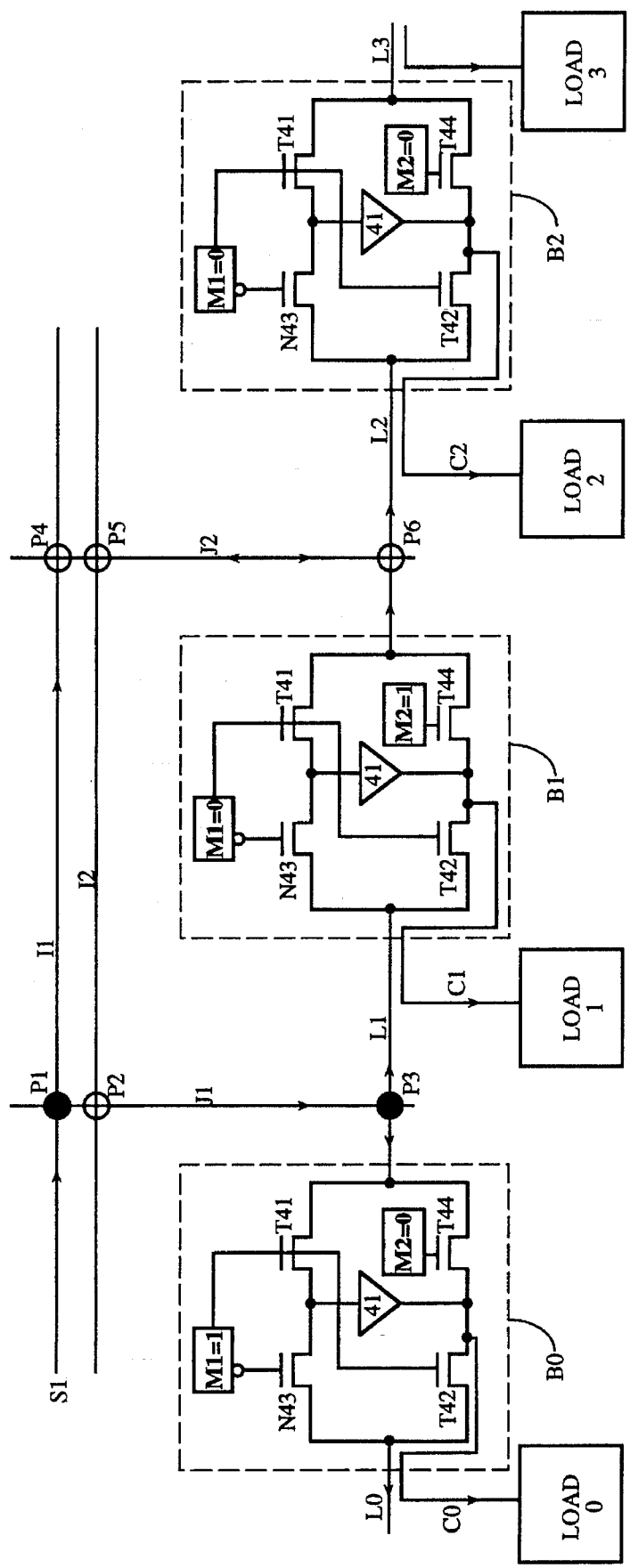
FIG. 7 illustrates tristate bidirectional buffers of the invention joining a series of line segments, with loads attached directly to buffer element output terminals instead of the line segments.

FIG. 7 shows a structure similar to that in FIG. 6 except that loads LOAD0–LOAD3 are driven by their respective buffer output terminals on lines C0–C3 rather than by their respective lines L0–L3. The speed advantage of FIG. 7 with respect to FIG. 6 can be seen by examining the example configuration shown in FIGS. 6 and 7. In FIG. 6, signal S1 must drive load LOAD1 as well as the input terminals of buffer elements 41 in buffers B0 and B1. In FIG. 7, signal S1 must drive only the input terminals of buffer elements 41 in buffers B0 and B1, but need not drive load LOAD1 because that load is driven by buffer element 41 in buffer B1. Another advantage of FIG. 7 is that buffer element 41 drives its load through no intervening pass gate, while in FIG. 6 buffer element 41 drives its load through an intervening pass gate. Since signal S1 may travel a long path encountering significant resistance, decreasing the load driven by S1 can significantly increase speed. Buffer element 41 in buffer B1 must drive a load in both FIGS. 6 and 7, load LOAD2 in the case of FIG. 6, and load LOAD1 in the case of FIG. 7. These loads may be different, and thus one embodiment may be preferred over the other because of this difference. Logically, the two embodiments are equivalent.

The structure of FIG. 6 has the advantage that the line connecting a load such as LOAD1 may have a physically shorter length than in FIG. 7. If load LOAD1 is small and the line length for FIG. 7 is large, the structure of FIG. 6 may be preferred. However, if the load is relatively large and the line length for FIG. 7 is relatively short, then the structure of FIG. 7 may be preferred. In a commercial embodiment, there are likely to be several loads driven by a line such as L1 and several connection lines such as J1 which can serve as signal sources to a line such as L1. A commercial product may well use a combination of the structures illustrated in FIGS. 6 and 7.

In light of the above discussion, other embodiments of the invention will become obvious to those skilled in the art. For example, single transistors for controlling buffer direction may be replaced by transmission gates. And the buffer element may be replaced by an inverter. And though FIGS. 3–5 show memory cells for controlling the direction, in another embodiment signals derived from another source may be used for controlling the buffer direction. Such other embodiments are intended to be included in the scope of the present invention.

I claim:

1. A bidirectional tristate buffer comprising:

a buffer element having an input terminal and an output terminal;

first and second signal lines;

a first transistor connected between said first signal line and said input terminal of said buffer element;

a second transistor connected between said second signal line and said input terminal of said buffer element;

a third transistor connected between said first signal line and said output terminal of said buffer element;

a fourth transistor connected between said second signal line and said output terminal of said buffer element;

first control means for controlling said first, second and third transistors; and second control means for controlling said fourth transistor;

said first control means having first and second states, and being connected to said first, second, and third transistors such that in said first state said first transistor is conductive and said second and third transistors are not conductive, and in said second state said first transistor is not conductive and said second and third transistors are conductive.

2. A bidirectional tristate buffer as in claim 1 in which said first and second control means comprise first and second memory cells.

3. A bidirectional tristate buffer as in claim 1 in which said first and second control means comprise routing lines in an FPGA.

4. A bidirectional tristate buffer as in claim 1 in which said first transistor is a P-channel transistor and said second and third transistors are N-channel transistors, and said first memory cell provides a single signal for controlling said first, second and third transistors.

5. A bidirectional tristate buffer as in claim 1 in which said first, second, and third transistors are N-channel transistors, and said first memory cell provides a first signal for controlling said first transistor and the complement of said first signal for controlling said second and third transistors.

6. A bidirectional tristate buffer as in claim 1 further comprising a third signal line connected to said output terminal of said buffer element.

* * * * *